United States Patent
Seol et al.

(10) Patent No.: US 8,531,898 B2
(45) Date of Patent: Sep. 10, 2013

(54) ON-DIE TERMINATION CIRCUIT, DATA OUTPUT BUFFER AND SEMICONDUCTOR MEMORY DEVICE

(75) Inventors: Ho-Seok Seol, Daegu (KR); Young-Soo Sohn, Seoul (KR); Dong-Min Kim, Seoul (KR); Jin-Il Lee, Hwaseong-si (KR); Kwang-Il Park, Yongin-si (KR); Seung-Jun Bae, Hwaseong-si (KR); Sang-Hyup Kwak, Seoul (KR)

(73) Assignee: Samsung Electronics Co., Ltd. (KR)

( * ) Notice: Subject to any disclaimer, the term of this patent is extended or adjusted under 35 U.S.C. 154(b) by 140 days.

(21) Appl. No.: 13/048,219

(22) Filed: Mar. 15, 2011

(65) Prior Publication Data

US 2011/0242916 A1     Oct. 6, 2011

Related U.S. Application Data

(60) Provisional application No. 61/320,567, filed on Apr. 2, 2010.

(30) Foreign Application Priority Data

Sep. 8, 2010 (KR) .................. 10-2010-0087872

(51) Int. Cl.
*G11C 7/00* (2006.01)

(52) U.S. Cl.
USPC .................. 365/198; 365/189.05; 365/230.08

(58) Field of Classification Search
USPC .................. 365/198, 189.05, 230.08, 230.06
See application file for complete search history.

(56) References Cited

U.S. PATENT DOCUMENTS

| | | | |
|---|---|---|---|
| 6,621,329 B2 | 9/2003 | Kajimoto | |
| 6,628,223 B2 | 9/2003 | Nagano | |
| 6,714,047 B2 | 3/2004 | Shimizu et al. | |
| 6,927,600 B2 | 8/2005 | Choe | |
| 6,928,007 B2 * | 8/2005 | Jin | 365/194 |
| 6,965,964 B2 * | 11/2005 | Lee et al. | 711/103 |
| 7,292,953 B2 | 11/2007 | Jung | |
| 7,480,776 B2 * | 1/2009 | Sohn et al. | 711/154 |
| 7,602,208 B2 * | 10/2009 | Jung | 326/30 |
| 7,683,657 B2 | 3/2010 | Kim | |
| 7,801,696 B2 | 9/2010 | Jung | |
| 7,919,978 B2 * | 4/2011 | Park | 326/30 |
| 2003/0080717 A1 | 5/2003 | Kajimoto | |
| 2003/0080891 A1 | 5/2003 | Nagano | |
| 2003/0193349 A1 | 10/2003 | Shimizu et al. | |
| 2004/0124902 A1 | 7/2004 | Choe | |
| 2005/0248375 A1 | 11/2005 | Jung | |
| 2005/0251356 A1 | 11/2005 | Jung | |
| 2008/0030222 A1 | 2/2008 | Jung | |
| 2009/0146683 A1 | 6/2009 | Kim | |

FOREIGN PATENT DOCUMENTS

| | | |
|---|---|---|
| JP | 2000-307410 | 11/2000 |
| JP | 2003-143002 | 5/2003 |
| JP | 2005-322379 | 11/2005 |

(Continued)

*Primary Examiner* — Pho M Luu

(74) *Attorney, Agent, or Firm* — Onello & Mello, LLP

(57) ABSTRACT

An on-die termination circuit includes a termination resistor unit connected to an external pin, and a termination control unit connected to the termination resistor unit. The termination resistor unit provides termination impedance to a transmission line connected to the external pin. The termination control unit varies the termination impedance in response to a plurality of bits of strength code associated with a data rate.

19 Claims, 16 Drawing Sheets

(56) References Cited

FOREIGN PATENT DOCUMENTS

| | | |
|---|---|---|
| JP | 3927788 | 6/2007 |
| JP | 4020680 | 12/2007 |
| JP | 2008-300022 | 12/2008 |
| JP | 2009-116641 | 5/2009 |
| KR | 10-0502666 | 7/2005 |
| KR | 10-0904482 | 6/2009 |
| KR | 10-2009-0108800 | 10/2009 |
| KR | 10-0924016 | 10/2009 |

* cited by examiner

20

ON-DIE TERMINATION CIRCUIT, DATA OUTPUT BUFFER AND SEMICONDUCTOR MEMORY DEVICE

CROSS-REFERENCE TO RELATED APPLICATION(S)

This US non-provisional application claims the benefit of priority under 35 USC §119 to U.S. Provisional Application No. 61/320,567 filed on Apr. 2, 2010 in the USPTO, and Korean Patent Application No. 10-2010-0087872 filed on Sep. 8, 2010 in the Korean Intellectual Property Office (KIPO), the contents of which applications are herein incorporated by reference in their entirety.

BACKGROUND OF THE INVENTION

1. Technical Field

Exemplary embodiments relate to semiconductor devices, and more particularly to an on-die termination circuit, a data output buffer and a semiconductor memory device.

2. Description of the Related Art

On-die termination (ODT) refers to an integrated circuit configuration in which termination resistance for transmission lines is integrated within the circuit chip die, rather than on a separate external chip or on a separate external circuit board. ODT has been developed to improve signal integrity by reducing signal reflection at an interface between a memory controller and a memory device. An ODT circuit may suppress the signal reflection by providing a termination resistor (RTT) matched to an impedance of a transmission line.

SUMMARY OF THE INVENTION

Accordingly, the inventive concept is provided to substantially obviate one or more drawbacks due to limitations and disadvantages of the related art.

Some exemplary embodiments provide an on-die termination (ODT) circuit capable of reducing power consumption.

Some exemplary embodiments provide a data output buffer capable of reducing power consumption.

Some exemplary embodiments provide a semiconductor memory device including the data output buffer.

According to one aspect, the inventive concept is directed to an ODT circuit which includes a termination resistor unit connected to an external pin, and a termination control unit, connected to the termination resistor unit. The termination resistor unit provides termination impedance to a transmission line connected to the external pin. The termination control unit varies the termination impedance in response to a plurality of bits of strength code associated with a data rate.

The termination control unit may decrease the termination impedance as the data rate increases.

The termination control unit may increase the termination impedance as the data rate decreases.

The strength code may be provided from an extended mode register set (EMRS) based on the data rate.

The termination control unit may generate a plurality of bits of termination control signal which is enabled in response to the strength code and an output enable signal. The termination resistor unit may include a plurality of transistors, each coupled to a power supply voltage and being controlled by a bit of the termination control signal, and a plurality of resistors, each connected between one of the transistors and the external pin.

Each of the transistors may be turned off in response to a bit of the termination control signal when the output enable signal designates a read mode.

According to another aspect, the inventive concept is directed to a data output buffer of a semiconductor memory device, which includes a driving unit and a control unit. The driving unit is coupled to an external pin and provides a driver impedance to a transmission line while performing a driver operation that provides read data to a memory controller through the transmission line connected to the external pin. The control unit is connected to the driving unit and controls the driving unit to perform the driver operation in response to an output enable signal, and generates a driving control signal for controlling the driving unit by combining the read data and a strength code associated with a data rate. The driver impedance is varied in response to the strength code.

The output enable signal may be enabled in a read mode. The control unit may generate a pull-up driving control signal and a pull-down driving control signal by combining the read data and the strength code, and may provide the pull-up driving control signal and the pull-down driving control to the driving unit in response to the output enable signal.

The driving unit may include a pull-up driver connected to a power supply voltage and the external pin, which receives the pull-up driving control signal, and a pull-down driver connected to a ground voltage and the external pin, which receives the pull-down driving control signal.

The pull-up driver may provide a pull-up driver impedance that is varied in response to the pull-up driving control signal.

The pull-down driver may provide a pull-down driver impedance that is varied in response to the pull-down driving control signal.

The pull-up driver may include a plurality of p-type metal oxide semiconductor (PMOS) transistors, each PMOS transistor being connected to the power supply voltage and being turned on in response to a bit of the pull-up driving control signal, and a plurality of resistors, each resistor being connected between one of the PMOS transistors and the external pin.

The pull-down driver may include a plurality of n-type MOS (NMOS) transistors, each NMOS transistor being connected to the ground voltage and being turned on in response to a bit of the pull-down driving control signal, and a plurality of resistors, each resistor being connected between one of the NMOS transistors and the external pin.

The power supply voltage may be about 0.2 [V].

According to another aspect, the inventive concept is directed to a semiconductor memory device, which includes a memory core and a data output buffer. The memory core stores data and generates read data based on the stored data. The data output buffer outputs the read data from the memory core to a memory controller through a transmission line connected to an external pin, and provides a driver impedance to the transmission line in a read mode. The driver impedance is varied in response to a plurality of bits of strength code associated with a data rate.

According to another aspect, the inventive concept is directed to a semiconductor memory device, which includes an on-die termination (ODT) circuit and a data output buffer. The ODT circuit comprises: a termination resistor unit, connected to an external pin, configured to provide termination impedance to a transmission line connected to the external pin, and a termination control unit, connected to the termination resistor unit, configured to vary the termination impedance in response to a plurality of bits of strength code associated with a data rate. The data output buffer comprises: a driving unit, coupled to the external pin, configured to provide a driver impedance to the transmission line while performing a driver operation that provides read data to a memory controller through the transmission line connected to the external pin; and a control unit, connected to the driving unit, configured to control the driving unit to perform the driver operation in response to an output enable signal, and to generate a driving control signal for controlling the driving unit by combining the read data and the strength code associated with the data rate, the driver impedance being varied in response to the strength code.

In some embodiments, the strength code is provided from an extended mode register set (EMRS) based on the data rate.

In some embodiments, the termination control unit generates a plurality of bits of termination control signal which is enabled in response to the strength code and an output enable signal. The termination resistor unit includes a plurality of transistors, each transistor being coupled to a power supply voltage and being controlled by a bit of the termination control signal, and a plurality of resistors, each resistor being connected between one of the transistors and the external pin.

In some embodiments, the output enable signal is enabled in a read mode. The control unit generates a pull-up driving control signal and a pull-down driving control signal by combining the read data and the strength code, and provides the pull-up driving control signal and the pull-down driving control signal to the driving unit in response to the output enable signal.

In some embodiments, the driving unit comprises: a pull-up driver, connected to a power supply voltage and the external pin, the pull-up driver receiving the pull-up driving control signal; and a pull-down driver, connected to a ground voltage and the external pin, the pull-down driver receiving the pull-down driving control signal.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept.

DETAILED DESCRIPTION

Figure 1:
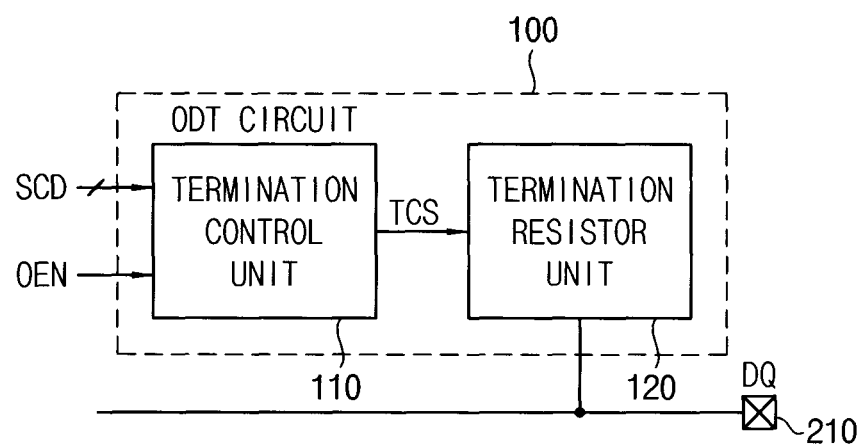
FIG. 1 is a schematic block diagram illustrating an on-die termination (ODT) circuit, according to some exemplary embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the present inventive concept to those skilled in the art. In the drawings, the sizes and relative sizes of layers and regions may be exaggerated for clarity.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a schematic block diagram illustrating an on-die termination (ODT) circuit according to some exemplary embodiments.

Referring to FIG. 1, an ODT circuit 100 includes a termination control unit 110 and a termination resistor unit 120.

The termination resistor unit 120 is coupled to an external pin or terminal 210.

The termination resistor unit 120 provides termination impedance to a transmission line coupled to the external pin 210. For example, the external pin 210 may be an external connection pin or terminal for any type of signal. Specifically, for example, the external pin 210 can be a data input/output (DQ) pin, a data strobe (DQS) pin, a data mask (DM) pin, a termination data strobe (TDQS) pin, or the like. The term "pin" broadly refers to an electrical interconnection for an integrated circuit, e.g., a pad or other electrical contact on the integrated circuit.

The termination resistor unit 120 may perform a pull-up termination operation. To that end, the termination resistor unit 120 includes a termination resistor coupled between a power supply voltage and the external pin 210. When the termination resistor unit 120 performs the pull-up termination operation, a voltage of the transmission line may be maintained substantially at the power supply voltage. A conventional ODT circuit performs a center termination operation. As a result, a DC current flows through a current path formed by the conventional ODT circuit, resulting in undesirable power consumption. In contrast, according to the inventive concept, a current flows through the termination resistor unit 120 and the transmission line only when data of a low level are transferred. As a result, according to the inventive concept, the termination resistor unit 120 performing the pull-up termination operation reduces power consumption.

As shown in FIG. 1, the termination control unit 110 is coupled to the termination resistor unit 120. The termination control unit 110 varies the termination impedance in the termination resistor unit 120 in response to a received plurality of bits of strength code SCD associated with a data rate. The data rate refers to an operating frequency of a semiconductor memory device that includes the ODT circuit 100, or a toggle rate of data that is input to the semiconductor memory device through the external pin 210. The strength code SCD may be input from a memory controller through a control pin. For example, the control pin may be an ODT pin. In other embodiments, the memory device including the ODT circuit 100 may generate the strength code SCD. For example, the memory device including the ODT circuit 100 may generate the strength code SCD in an extended mode register set (EMRS), illustrated in FIG. 2A.

The termination control unit 110 receives the strength code SCD and an output enable signal OEN. The termination control unit 110 may generate a termination control signal TCS for controlling the termination resistor unit 120 to adjust the termination impedance based on the strength SCD and an output enable signal OEN. The output enable signal OEN may be active during a read mode, e.g., a memory read mode. That is, the output enable signal OEN may be active while data are output through the transmission line. While the output enable signal OEN is active, the termination control unit 110 may provide termination control signal TCS at a predetermined logic level to control the termination resistor unit 120 not to provide the termination impedance. In that case, the termination resistor unit 120 may be electrically decoupled from the external pin 210 in response to the termination control signal TCS having the predetermined logic level.

While the output enable signal OEN is inactive, the termination control unit 110 may generate the termination control signal TCS to control the termination resistor unit 120 to provide the termination impedance. The termination control unit 110 may change a logic level of the termination control signal TCS in response to the strength code SCD to vary the termination impedance. For example, when the strength code SCD designates the operating frequency to be in a first range, the termination resistor unit 120 may be controlled to provide the termination impedance having a first resistance in response to the termination control signal TCS. Similarly, for example, when the strength code SCD designates the operating frequency in a second range, the termination resistor unit 120 may be controlled to provide the termination impedance having a second resistance in response to the termination control signal TCS. That is, for the two different operating frequency ranges, the termination control signal TCS may be generated to set the termination impedance to two different resistances, respectively. When the first range is higher than the second range, the first resistance may be greater than the second resistance.

Figure 2A:
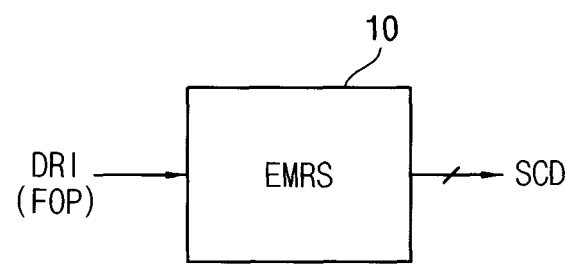
FIGS. 2A and 2B are schematic diagrams illustrating strength code providing circuits, according to some exemplary embodiments.
Figure 2B:
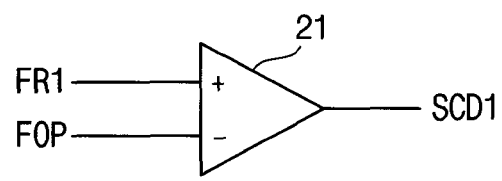
Figure 2B:
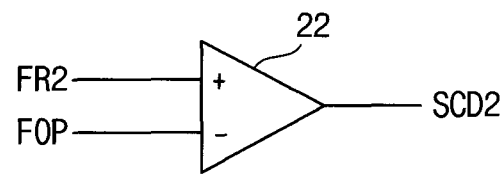
Figure 2B:
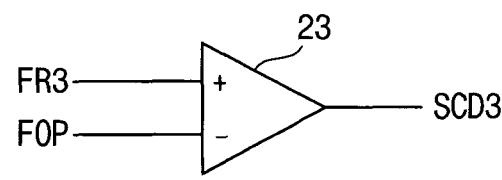

FIGS. 2A and 2B include schematic block diagrams which illustrate strength code providing circuits, i.e., circuits which generate and provide the strength code SCD to the termination control unit 110, according to some exemplary embodiments.

Referring to FIG. 2A, a strength code providing circuit 10 according to embodiments of the inventive concept may be implemented with an extended mode register set (EMRS). The EMRS receives data rate information DRI, i.e., the operating frequency FOP, and generates and provides a plurality of bits of strength code SCD according to the operating frequency FOP. The EMRS may be included in a semiconductor memory device or in a memory controller external to the semiconductor memory device.

Referring to FIG. 2B, a strength code providing circuit 20 according to embodiments of the inventive concept includes a plurality of comparators 21, 22 and 23. The comparator 21 compares the operating frequency FOP and a first reference frequency FR1 to output a first strength code SCD1 based on the comparison. The comparator 22 compares the operating frequency FOP and a second reference frequency FR2 to output a second strength code SCD2. The comparator 23 compares the operating frequency FOP and a third reference frequency FR3 to output a second strength code SCD3. For example, to illustrate the operation of the strength code providing circuit 20, when, for example, the first reference frequency FR1 is lower than the second reference frequency FR2, the second reference frequency FR2 is lower that the third reference frequency FR3, and the operating frequency FOP is between the first reference frequency FR1 and the second reference frequency FR2, the first strength code SCD1 is logic low level, the second strength code SCD2 is logic high level, and the third strength code SCD3 is logic high level. That is, the strength code SCD may be [011]. When, for example, the operating frequency FOP is between the second reference frequency FR2 and the third reference frequency FR3, the strength code SCD may be [001]. For example, when the operating frequency FOP is higher than the third reference frequency FR3, the strength code SCD may be [000].

Figure 3:
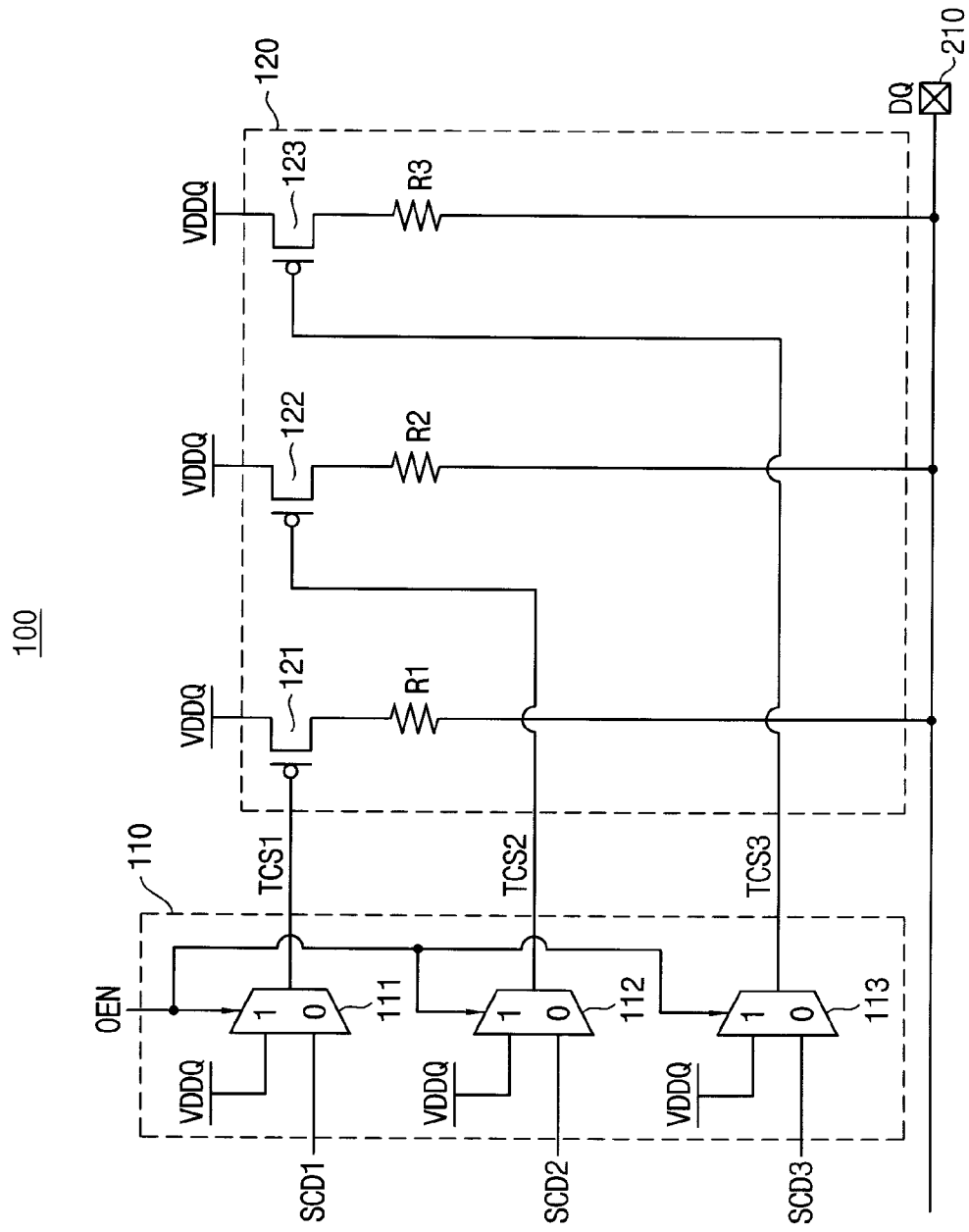
FIG. 3 is a schematic circuit diagram illustrating an example of an ODT circuit of FIG. 1, according to some exemplary embodiments.

FIG. 3 is a circuit diagram illustrating an example of an ODT circuit of FIG. 1, according to some embodiments.

Referring to FIG. 3, the termination control unit 110 may include a first selector 111, a second selector 112 and a third selector 113. In some embodiments, one or more of the first to third selectors 111, 112 and 113 may be implemented as multiplexers. The termination resistor unit 120 may be coupled to an external pin 210, and may include a first transistor 121, a first resistor R1, a second transistor 122, a second resistor R2, a third transistor 123 and a third resistor R3.

The first selector 111 may have a first input terminal coupled to a power supply voltage VDDQ, a second input terminal receiving the first strength code SCD1, a selection terminal for receiving the output enable signal OEN, and an output terminal for outputting a first termination control signal TCS1. The first selector 111 may selectively output the power supply voltage VDDQ or the first strength code SCD1 as the first termination control signal TCS1 in response to the output enable signal OEN.

The first transistor 121 may have a source coupled to the power supply voltage VDDQ, a gate coupled to the output terminal of the first selector 111 receiving the first termination control signal TCS1, and a drain coupled to the first resistor R1. The first resistor R1 may be coupled between the first transistor 121 and the external pin 210. The first transistor 121 may be turned on or off in response to the first termination control signal TCS1. The first resistor R1 may be electrically coupled or decoupled to or from the external pin 210 according to the on/off state of the first transistor 121.

The second selector 112 may have a first input terminal coupled to the power supply voltage VDDQ, a second input terminal receiving the second strength code SCD2, a selection terminal for receiving the output enable signal OEN, and an output terminal for outputting a second termination control signal TCS2. The second selector 112 may selectively output the power supply voltage VDDQ or the second strength code SCD2 as the second termination control signal TCS2 in response to the output enable signal OEN.

The second transistor 122 may have a source coupled to the power supply voltage VDDQ, a gate coupled to the output terminal of the second selector 112 receiving the second termination control signal TCS2, and a drain coupled to the second resistor R2. The second resistor R2 may be coupled between the second transistor 122 and the external pin 210. The second transistor 122 may be turned on or off in response to the second termination control signal TCS2. The second resistor R2 may be electrically coupled or decoupled to or from the external pin 210 according to the on/off state of the second transistor 122.

The third selector 113 may have a first input terminal coupled to the power supply voltage VDDQ, a second input terminal receiving the third strength code SCD3, a selection terminal for receiving the output enable signal OEN, and an output terminal for outputting a third termination control signal TCS3. The third selector 113 may selectively output the power supply voltage VDDQ or the third strength code SCD3 as the third termination control signal TCS3 in response to the output enable signal OEN.

The third transistor 123 may have a source coupled to the power supply voltage VDDQ, a gate coupled to the output terminal of the third selector 113 receiving the third termination control signal TCS3, and a drain coupled to the third resistor R3. The third resistor R3 may be coupled between the third transistor 123 and the external pin 210. The third transistor 123 may be turned on or off in response to the third termination control signal TCS3. The third resistor R3 may be electrically coupled or decoupled to or from the external pin 210 according to the on/off state of the third transistor 123.

The output enable signal OEN is active during a read mode, i.e., while data are output through a transmission line coupled to the external pin 210. As a result, the first selector 111 outputs the power supply voltage VDDQ as the first termination control signal TCS1, the second selector 112 outputs the power supply voltage VDDQ as the second termination control signal TCS2, and the third selector 113 outputs the power supply voltage VDDQ as the third termination control signal TCS3. Each of the first through third transistors 121, 122 and 123 is turned off in response to each of the first through first termination control signals TCS1, TCS2 and TCS 3 being at high levels. The first through third resistors R1, R2 and R3 are electrically decoupled from the external pin 210 by the turned-off first through third transistors 121, 122 and 123.

Accordingly, the ODT circuit 100 does not perform a termination operation during the read mode.

While the output enable signal OEN is inactive, the first selector 111 outputs the first strength code SCD1 as the first termination control signal TCS1, the second selector 112 outputs the second strength code SCD2 as the second termination control signal TCS2, and the third selector 113 outputs the third strength code SCD3 as the third termination control signal TCS3. Each of the first through third transistors 121, 122 and 123 is turned on/off in response to each logic level of the first through first termination control signals TCS1, TCS2 and TCS 3. The first through third resistors R1, R2 and R3 may be electrically coupled to/decoupled from the external pin 210 by the turned-on/off first through third transistors 121, 122 and 123.

For example, when the strength code SCD is [011], the first transistor 121 is turned on, and the first resistor R1 is electrically coupled to the external pin 210. The termination resistor unit 120 may provide the termination impedance using the first resistor R1. For example, when the strength code SCD is [001], the first and second transistors 121 and 122 are turned on, and the first and second resistors R1 and R2 are electrically coupled to the external pin 210. The termination resistor unit 120 may provide the termination impedance of parallel-connected first and second resistors R1 and R2. For example, when the strength code SCD is [000], the first to third transistors 121, 122 and 123 are turned on, and the first to third resistors R1, R2 and R3 are electrically coupled to the external pin 210. The termination resistor unit 120 may provide the termination impedance of parallel-connected first to third resistors R1, R2 and R3.

In some particular exemplary embodiments, resistance of the first resistor R1 may be substantially the same as resistance of the second resistor R2. Resistance of the third resistor R3 may be approximately half of the resistance of the second resistor R2. In some particular embodiments, for example, each of the first and second resistors R1 and R2 may have resistance of about 200 [Ω], and the third resistor R3 may have resistance of about 100 [Ω]. In this example, when the strength code SCD is [011], the termination impedance is 200 [Ω]; when the strength code SCD is [001], the termination impedance is 100 [Ω]; and when the strength code SCD is [000], the termination impedance is 50 [Ω]. It will be understood that these relationships among the resistances of the resistors R1, R2, and R3 are merely exemplary illustrations to aid with description of the invention. Any appropriate desired relations among the resistances can be used.

Although each of the first to third resistors R1, R2 and R3 is illustrated in FIG. 3 as a single resistor, in some embodiments, each of first to third resistors R1, R2 and R3 may be implemented with a plurality of resistors that are connected in parallel and/or in series and a plurality of transistors for controlling connections of the plurality of resistors. In some embodiments, impedance of each resistor may be adjusted by ZQ calibration.

As described above, the strength code SCD is associated with the data rate or the operating frequency. Accordingly, when the data rate is high, i.e., when the strength code SCD is [000], channels are rapidly charged/discharged by decreasing the termination impedance. When the data rate is comparatively low, i.e., when the strength code SCD is [011], current consumption may be reduced by increasing the termination impedance for decreasing DC currents flowing through the channels.

Figure 4:
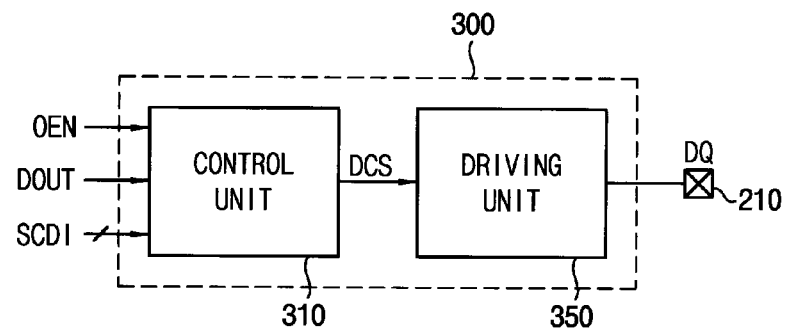
FIG. 4 is a schematic block diagram illustrating a data output buffer, according to some exemplary embodiments.

FIG. 4 is a schematic block diagram illustrating a data output buffer according to some exemplary embodiments.

Referring to FIG. 4, a data output buffer 300 according to some exemplary embodiments includes a control unit 310 and a driving unit 350.

The driving unit 350 is coupled to an external pin 210. The driving unit 350 performs a driver operation to transfer read data DOUT to a memory controller through a transmission line coupled to the external pin 210, while providing termination impedance to the transmission line coupled to the external pin 210. As noted above, the external pin 210 may be a data input/output pin, a data strobe pin, or the like. The driving unit 350 may perform a pull-up termination operation or a pull-down termination operation as the termination operation.

The control unit 310 is coupled to the driving unit 350. The control unit 310 may control the driving unit 350 to perform driver operation in response to an output enable signal OEN. The control unit 310 generates a driving control signal DCS for controlling the driving unit 350 using the read data DOUT and the strength code SCDI associated with the data rate. The driver impedance may be varied in response to the strength code SCDI.

Figure 5:
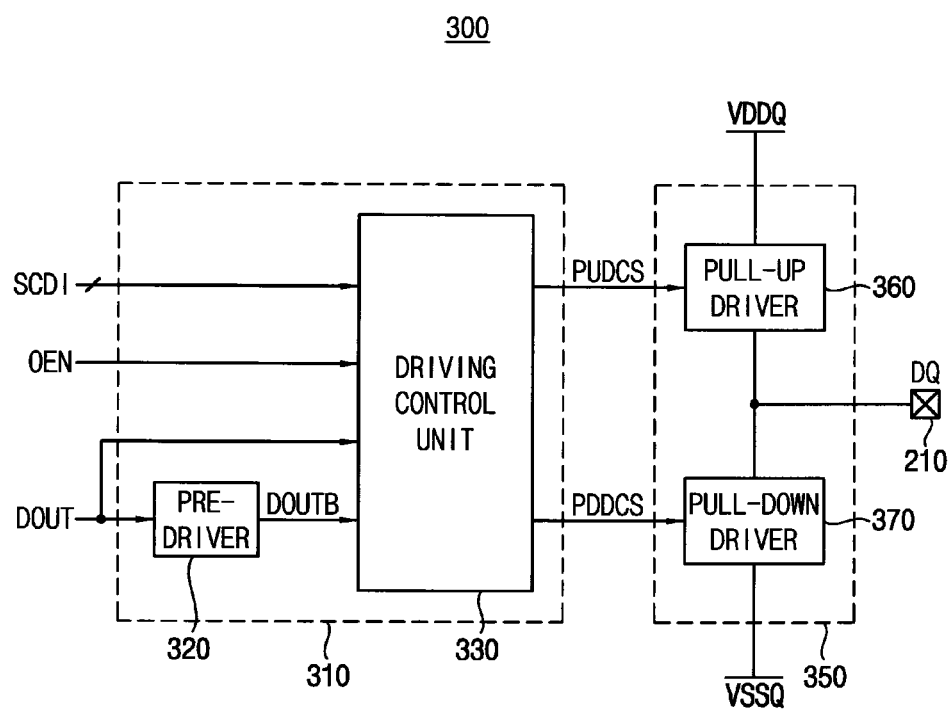
FIG. 5 is a schematic block diagram illustrating an example of a data output buffer of FIG. 4, according to some exemplary embodiments.

FIG. 5 is a schematic block diagram illustrating an example of a data output buffer of FIG. 4, according to some embodiments.

Referring to FIG. 5, a data output buffer 300 according to some exemplary embodiments includes a control unit 310 and a driving unit 350. The control unit 310 includes a pre-driver 320 and a driving control unit 330. The driving unit 350 includes a pull-up driver 360 and a pull-down driver 360.

The pre-driver 320 may receive read data DOUT from a memory core, and may provide an inverted version of the read data, i.e., inverted read data, DOUTB to the driving control unit 330 by inverting the read data DOUT. The driving control unit 330 may generate a pull-up driving control signal PUDCS by combining the read data DOUT and the strength code SCDI, and may generate a pull-down driving control signal PDDCS by combining the inverted read data DOUTB and the strength code SCDI. The driving control unit 330 may provide the pull-up driving control signal PUDCS and the pull-down driving control signal PDDCS to the pull-up driver 360 and the pull-down driver 370, respectively, of the driving unit 350 in response to the output enable signal OEN.

The pull-up driver 360 provides a pull-up driver impedance to the transmission line connected to the external pin 210 while performing driving operation in response to the pull-up driving control signal PUDCS. The pull-up driver impedance is varied in response to the pull-up driving control signal PUDCS. The pull-down driver 370 provides a pull-down driver impedance to the transmission line connected to the external pin 210 while performing driving operation in response to the pull-down driving control signal PDDCS. The pull-down driver impedance is varied in response to the pull-down driving control signal PDDCS FIG. 6 is a schematic circuit diagram illustrating an example of the data output buffer of FIG. 5 in detail, according to some embodiments.

Figure 6:
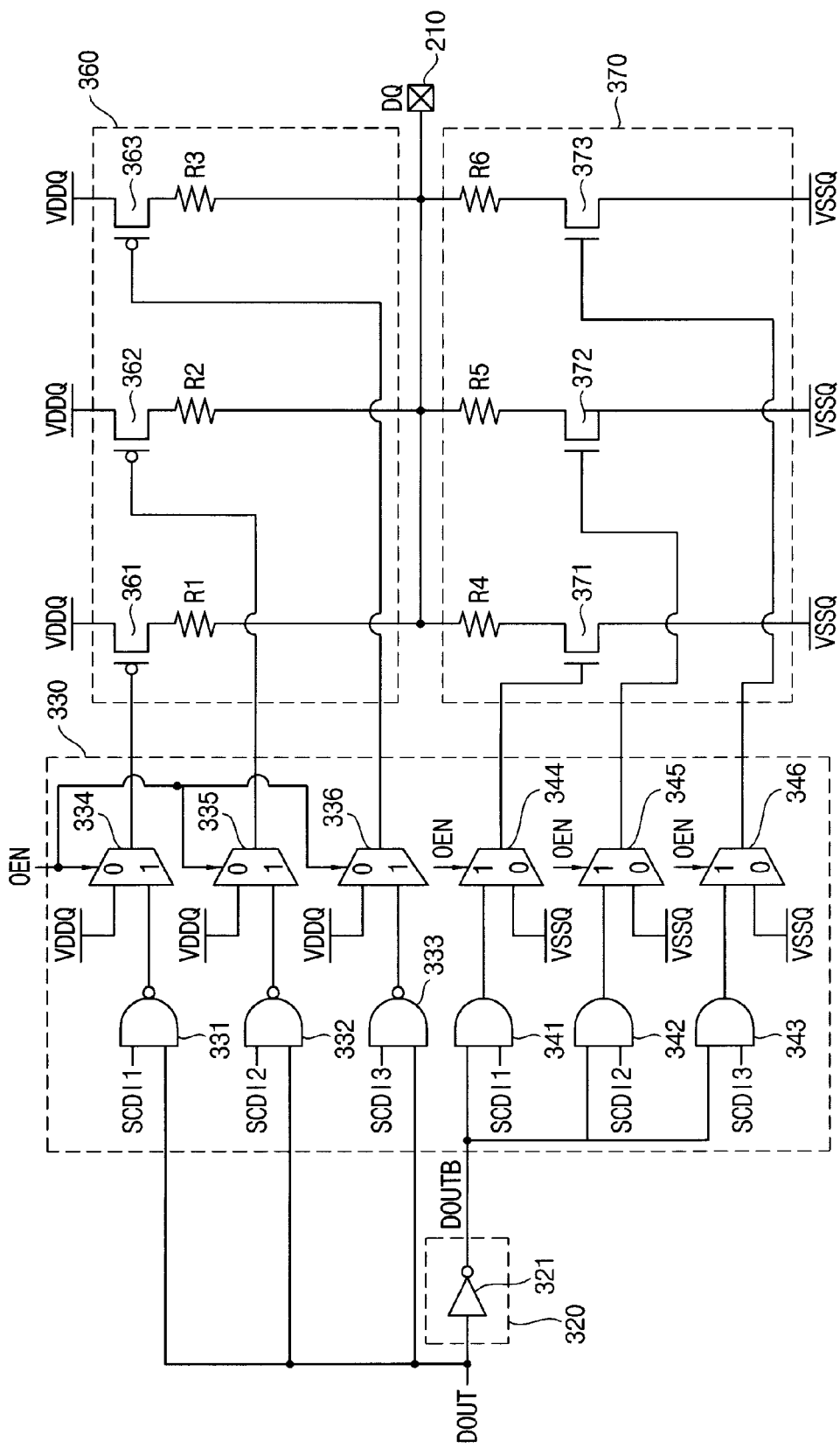
FIG. 6 is a schematic circuit diagram illustrating an example of the data output buffer of FIG. 5, according to some exemplary embodiments.

Referring to FIG. 6, the pre-driver 320 may include an inverter 321. The driving control unit 330 may include first to third NAND gates 331~333, first to third selectors 334~336, first to third AND gates 341~343 and fourth to sixth selectors 344~346. The pull-up driver 360 may include first to third PMOS transistors 361~363 and first to third resistors R1~R3. The first to third PMOS transistors 361~363 are connected to a power supply voltage VDDQ, and each of the first to third resistors R1~R3 is connected between a respective one of the first to third PMOS transistors 361~363 and the external pin 210. The pull-down driver 370 may include first to third NMOS transistors 371~373 and fourth to sixth resistors R4~R6. The first to third NMOS transistors 371~373 are connected to a ground voltage VSSQ, and each of the fourth to sixth resistors R4~R4 is connected between a respective one of the first to third NMOS transistors 371~373 and the external pin 210.

The inverter 321 may output inverted read data DOUTB by inverting read data DOUT received from a memory core. Each of the NAND gates 331~333 performs a NAND operation on the read data DOUT and each of the first to third strength codes SCDI1, SCDI2, and SCDI3. Each of the AND gates 341~343 performs an AND operation on the inverted read data DOUTB and each of the first to third strength codes SCDI1, SCDI2, and SCDI3. Each of the selectors 334~336 has each of first input terminals receiving a respective one of the first to third strength codes SCDI1, SCDI2, and SCDI3, has each of second input terminals receiving the read data DOUT via a respective NAND gate 331~333, and has a control terminal receiving the output enable signal OEN. Each of the selectors 344~346 has each of first input terminals receiving the inverted read data DOUTB via a respective AND gate 341~343, has each of second input terminals receiving a respective one of the first to third strength codes SCDI1, SCDI2, and SCDI3, and has a control terminal receiving the output enable signal OEN.

While the output enable signal OEN is inactive at a low level, each of the selectors 334~336 may output the pull-up driving control signal PUDCS at a high level, and each of the selectors 344~346 may output the pull-down driving control signal PDDCS at a low level. Each of the PMOS transistors 361~363 is turned off in response to the pull-up driving control signal PUDCS at a high level, and each of the NMOS transistors 371~373 is turned off in response to the pull-down driving control signal PDDCS at low level. Accordingly, the resistors R1~R3 may be electrically decoupled from the external pin 210, and the resistors R4~R6 may be electrically decoupled from the external pin 210.

While the output enable signal OEN is active at a high level during a read mode, each of the selectors 334~336 may output the outputs of the NAND gates 331~333, respectively, as the pull-up driving control signal PUDCS to the pull-up driver 360, and each of the selectors 344~346 may output the outputs of the AND gates 341~343, respectively, as the pull-down driving control signal PDDCS to the pull-down driver 370.

During the read mode, the pull-up driver 360 and the pull-down driver 370 may provide driver impedance while performing the driving operation based on the read data DOUT. For example, when the read data DOUT has a high level, the inverted read data DOUTB has a low level, and thus, each output of the AND gates 341~343 has a low level irrespective of the strength codes SCDI1, SCDI2, and SCDI3. Accordingly, each of the selectors 344~346 may output pull-down driving control signal PDDCS at low level. Therefore, the NMOS transistors 371~373 may be turned off, and the resistors R4~R6 may be decoupled from the external pin 210. Also, each output of the NAND gates 331~333 has a reverse logic level with respect to each logic level of the strength codes SCDI1, SCDI2, and SCDI3, because the read data DOUT has a high level. For example, when the strength code SCDI is [100], the outputs of the NAND gates 331~333 are [011]. Therefore, the pull-up driving control signal PUDCS of [011] is applied to the pull-up driver 360. The PMOS transistor 361 is turned on, and the PMOS transistors 362 and 363 are turned off. Accordingly, the resistor R1 may be electrically coupled to the external node 210, and the resistors R2 and R3 may be electrically decoupled from the external node

210. Therefore, the pull-up driver 360 may transfer the read data DOUT at the high level through the transmission line while providing the pull-up driver impedance of the resistor R1.

For example, when the read data DOUT has a low level, each output of the NAND gates 331~333 has a high level irrespective of the strength codes SCDI1, SCDI2, and SCDI3. Accordingly, each of the selectors 334~336 may output pull-up driving control signal PUDCS at a high level. Therefore, the PMOS transistors 361~363 may be turned off, and the resistors R1~R3 may be decoupled from the external pin 210. Each output of the AND gates 341~343 has a same logic level as each logic level of the strength codes SCDI1, SCDI2, and SCDI3, because the read data DOUT has a low level and, therefore, the inverted read data DOUTB applied to the AND gates 341~343 had a high level. For example, when the strength code SCDI is [100], the outputs of the AND gates 341~343 are [100]. Therefore, the pull-down driving control signal PDDCS of [100] is applied to the pull-down driver 370. The NMOS transistor 371 is turned on, and the NMOS transistors 372 and 373 are turned off. Accordingly, the resistor R4 may be electrically coupled to the external node 210, and the resistors R2 and R3 may be electrically decoupled from the external node 210. Therefore, the pull-down driver 370 may transfer the read data DOUT at the low level through the transmission line while providing the pull-down driver impedance of the resistor R4.

As described with reference to FIG. 4, the strength code SCDI is associated with the data rate or the operating frequency. Accordingly, when the data rate is high, i.e., when the strength code SCDI is [111], channels are rapidly charged/discharged by decreasing the termination impedance. When the data rate is comparatively low, i.e., when the strength code SCDI is [100], current consumption may be reduced by increasing the termination impedance for decreasing DC currents flowing through the channels.

When the strength code SCDI is [111] and the read data DOUT is at a high level, the pull-up driving control signal PUDCS is [000]. Accordingly, the pull-up driver 360 may transfer the read data DOUT at the high level through the transmission line connected to the external pin 210 while providing the pull-up driver impedance of parallel-connected resistors R1, R2 and R3. When the strength code SCDI is [111] and the read data. DOUT is at a low level, the pull-down driving control signal PDDCS is [111]. Accordingly, the pull-down driver 370 may transfer the read data DOUT at the low level through the transmission line connected to the external pin 210 while providing the pull-down driver impedance of parallel-connected resistors R4, R5 and R6. When the strength code SCDI is [100] and the read data DOUT is at a high level, the pull-up driving control signal PUDCS is [011]. Accordingly, the pull-up driver 360 may transfer the read data DOUT at the high level through the transmission line connected to the external pin 210 while providing the pull-up driver impedance of resistor R1. When the strength code SCDI is [100] and the read data DOUT is at a low level, the pull-down driving control signal PDDCS is [100]. Accordingly, the pull-down driver 370 may transfer the read data DOUT at the low level through the transmission line connected to the external pin 210 while providing the pull-down driver impedance of resistor R4.

In some particular exemplary embodiments, resistance of the first resistor R1 may be substantially the same as resistance of the second resistor R2. Resistance of the third resistor R3 may be approximately half of the second resistor R2. In addition, each resistance of the resistors R4, R5 and R6 may be substantially the same as each resistance of the resistors R1, R2 and R3, respectively. For example, in some particular embodiments, each of the first and second resistors R1 and R2 may have resistance of about 200 [Ω], and the third resistor R3 may have resistance of about 100 [Ω]. When the strength code SCDI is [100] and the read data DOUT is high level, the pull-up driver impedance may be 200 [Ω]. When the strength code SCDI may be [110], the pull-up driver impedance may be 100 [Ω]. When the strength code SCDI may be [111], the termination impedance may be 50 [Ω]. It will be understood that these relationships among the resistances of the resistors R1, R2, and R3 are merely exemplary illustrations to aid with description of the invention. Any appropriate desired relations among the resistances can be used.

Although each of the first to sixth resistors R1~R6 is illustrated in FIG. 6 as a single resistor, in some embodiments, each of the first to sixth resistors R1~R6 may be implemented with a plurality of resistors that are connected in parallel and/or in series and a plurality of transistors for controlling connections of the plurality of resistors. In some embodiments, impedance of each resistor may be adjusted by ZQ calibration.

Figure 7:
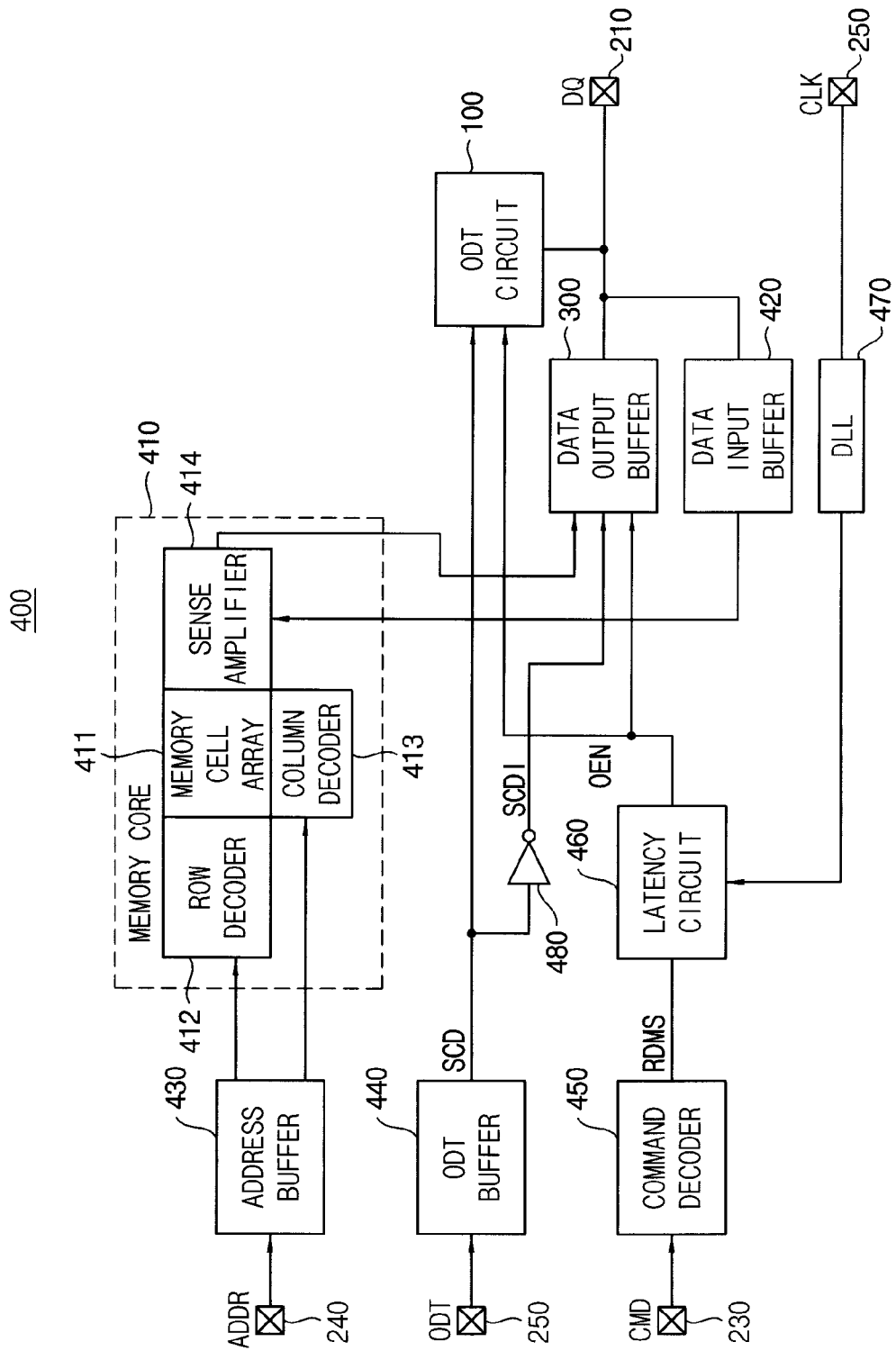
FIG. 7 is a schematic block diagram illustrating a semiconductor memory device, according to some exemplary embodiments.

FIG. 7 is a schematic block diagram illustrating a semiconductor memory device including an ODT circuit of the type illustrated and described above in connection with FIG. 1 and a data output buffer of the type illustrated in and described above in connection with FIG. 4, according to some exemplary embodiments.

Referring to FIG. 7, a semiconductor memory device 400 according to some embodiments includes a memory core 410, a data output buffer 300, a data input buffer 420, an address buffer 430, an ODT buffer 440, a command decoder 450, a latency circuit 460, a clock synchronization circuit 470, an inverter 480 and an ODT circuit 100.

The memory core 410 stores write data provided from the data input buffer 420, and provides read data to the data output buffer 300 based on the stored write data. The memory core 410 may include a memory cell array 411 having a plurality of memory cells that store data, a row decoder 412 for selecting a word line of the memory cell array 411 by decoding a row address RA received from the address buffer 430, a column decoder 413 for selecting at least one bit line of the memory cell array 411 by decoding a column address CA received from the address buffer 430, and a sense amplifier 414 for generating the read data by sensing the data stored in selected memory cells.

The address buffer 430 provides the row address RA and the column address CA to the row decoder 412 and the column decoder 413 based on an address signal ADDR received from a memory controller through an address pin 240. The command decoder 450 may decode a command signal CMD, such as a write enable signal (WE), a row address strobe signal (RAS), a column address strobe signal (CAS), a chip select signal (CS), etc., received from the memory controller through a command pin 230 to generate a control signal corresponding to the command signal CMD. The memory device 400 may further include a mode register for mode register setting. The clock synchronization circuit 470 may receive an external clock signal CLK through a clock pin 250, and may provide the latency circuit 460 and the data output buffer 300 with an internal clock signal synchronized with the external clock signal CLK. The clock synchronization circuit 470 may include a delay locked loop (DLL) circuit or a phase locked loop (PLL) circuit.

The data output buffer 300 and the data input buffer 420 are coupled to an external data input/output pin (DQ) 210. The data output buffer 300 may transfer the read data to the memory controller through the data input/output pin 210, and the data input buffer 420 may receive the write data from the memory controller through the data input/output pin 210. Although one data input/output pin 210, one data output buffer 300, and one data input buffer 420 are illustrated in FIG. 7 for convenience of illustration, the memory device 400 may include a plurality of data input/output pins, a plurality of data input buffers, and a plurality of data output buffers. Further, the memory device 400 may include a plurality of address pins and a plurality of command pins.

The ODT circuit 100 is coupled to the data input/output pin (DQ) 210. Although one ODT circuit 100 is illustrated in FIG. 7 for convenience of illustration, the memory device 400 may include a plurality of ODT circuits respectively coupled to a plurality of data input/output pins. In some embodiments, a single ODT circuit may be shared by a plurality of data input/output pins. The memory device 400 may further include a data strobe pin, a data mask pin, a termination data strobe pin, or the like, and may further include one or more ODT circuits respectively or commonly coupled thereto.

The ODT circuit 100 may vary the termination impedance in response to the strength code SCD received from the ODT buffer 440, as described above in detail. The ODT buffer 440 may receive the strength code SCD from the memory controller through an ODT pin 220, and may provide the strength code SCD to the ODT circuit 100 by buffering the strength code SCD.

The ODT circuit 100 may be electrically decoupled from the data input/output pin 210 in response to an output enable signal OEN received from the latency circuit 460. When the command decoder 450 receives a read command from the memory controller through the command pin 230, the command decoder 450 may generate a read mode signal RDMS and forward the RDMS signal to the latency circuit 460. The latency circuit 460 may receive the read mode signal RDMS from the command decoder 450, and may receive the internal clock signal synchronized with the external clock signal CLK from the clock synchronization circuit 470. In response the latency circuit 460 may generate the output enable signal OEN at a high level while the read data are output through the data input/output pin 210.

The ODT circuit 100 may be electrically decoupled from the data input/output pin 210 in response to the output enable signal OEN during a read mode when the read data are output through the data transmission line. The ODT circuit 100 may provide termination impedance that is varied in response to the strength code SCD during a write mode when the write data are input through the data transmission line, as described above in detail.

The data output buffer 300 may be electrically decoupled from the data input/output pin 210 in response to the output enable signal OEN received from the latency circuit 460. In addition, the data output buffer 300 may provide the driver impedance that is varied in response to an inverted strength code SCDI to the transmission line while transferring the read data to the transmission line during a read mode when the read data are output through the data transmission line. The strength code SCD is inverted by the inverter 480 to be provided as the inverted strength code SCDI. Therefore, the strength code SCD and the inverted strength code SCDI may be associated with the data rate or the operating frequency.

In the semiconductor memory device of FIG. 7, the ODT 100 circuit provides the termination impedance that is varied in response to the operating frequency to the transmission line in a write mode, thereby reducing the current consumption. Also, the data output buffer 300 provides the driver impedance that is varied in response to the operating frequency to the transmission line in a read mode, thereby reducing the current consumption.

Figure 8:
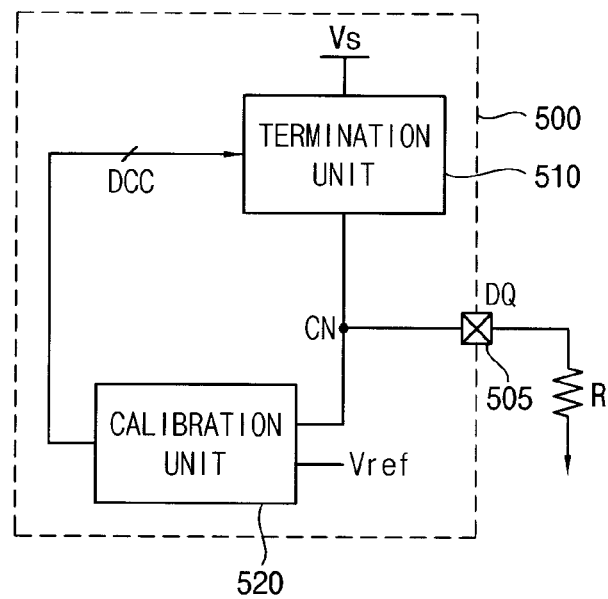
FIG. 8 is a schematic block diagram illustrating an ODT circuit, according to some exemplary embodiments.

FIG. 8 is a schematic block diagram illustrating an ODT circuit according to some exemplary embodiments.

Referring to FIG. 8, an ODT circuit 500 according to some exemplary embodiments may include a termination unit 510 and a calibration unit 520. The termination unit 510 is connected to a power supply voltage Vs having a fixed level. The termination unit 510 and the calibration unit 520 are connected to an external pin 505 at a calibration node CN. The external pin 505 is connected to an external resistor R via a channel. The termination unit 510 may provide a termination impedance that matches with the external resistor R to the channel connected to the external pin 505, in response to a digital control code DCC. The calibration unit 520 generates the digital control code DCC and forwards the DCC to the termination unit 510 based on a voltage of the calibration node CN and a reference voltage Vref, such that the termination impedance matches with the external resistor R. For example, the external pin 505 may be a data input/output (DQ) pin, a data strobe (DQS) pin, a data mask (DM) pin, a termination data strobe (TDQS) pin, or the like. The term "pin" broadly refers to an electrical interconnection for an integrated circuit, e.g., a pad or other electrical contact on the integrated circuit.

In some embodiments, the ODT circuit 500 varies the termination impedance provided from the termination unit 510 through the digital control code DCC such that the voltage level of the calibration node CN is substantially the same as the reference voltage Vref, and the termination impedance matches with the external resistor R.

Figure 9:
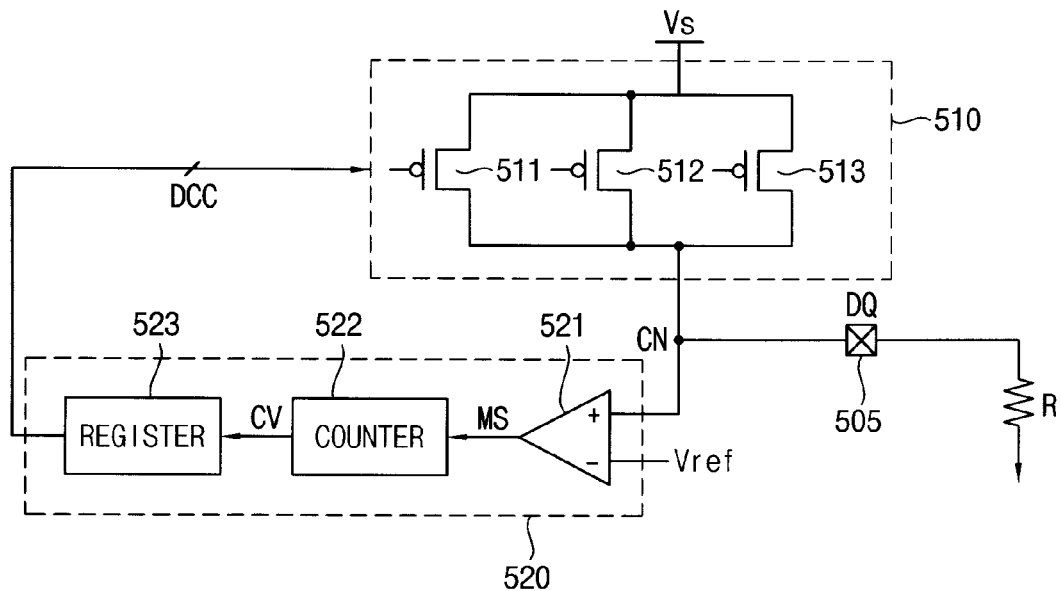
FIG. 9 is a schematic circuit diagram illustrating the ODT circuit of FIG. 8, according to some exemplary embodiments.

FIG. 9 is a schematic circuit diagram illustrating the ODT circuit of FIG. 8 in detail, according to some exemplary embodiments.

Referring to FIG. 9, the termination unit 510 includes a plurality of PMOS transistors 511, 512 and 513 connected between the power supply voltage Vs and the calibration node CN. Each of the PMOS transistors 511, 512 and 513 is turned on/off in response to a respective bit of the digital control code DCC at each gate. The voltage level of the calibration node CN may be varied in response to the PMOS transistors 511, 512 and 513 being turned on/off. In some embodiments, the PMOS transistors 511, 512 and 513 are different in size with respect to each other. For example, in some particular embodiments the size ratio of the PMOS transistors 511, 512 and 513 may be 4:2:1.

The calibration unit 520 includes a comparator 521, a counter 522 and a register 523. The comparator 521 compares the voltage of the calibration node CN and the reference voltage Vref to provide a matching signal MS indicating the comparison result to the counter 522. When the voltage level of the calibration node CN is higher than the reference voltage Vref, a positive matching signal MS is provided by the comparator 521 to the counter 522. When the voltage level of the calibration node CN is lower than the reference voltage Vref, a negative matching signal MS is provided by the comparator 521 to the counter 522. When the voltage level of the calibration node CN is same as the reference voltage Vref, the matching signal MS of "0" is provided to the counter 522. In some particular embodiments, the reference voltage Vref has a level that is half of the power supply voltage Vs.

The counter 522 outputs a counting value CV that is increases/decreases in response to the matching signal MS. For example, when the counter 522 receives a positive matching signal MS, the counter 522 outputs an increasing counting value CV. For example, when the counter 522 receives a negative matching signal MS at a low level, the counter 522 outputs a decreasing counting value CV. For example, when the counter 522 receives the matching signal MS of "0", the counter 522 maintains the counting value CV.

The register 523 stores the counting value CV, and provides the stored counting value CV as the digital control code DCC to the termination unit 510. For example, when the counter 522 receives the positive matching signal MS, the counter 522 outputs an increasing counting value CV, i.e., the digital control code DCC increases by one bit. As a result, the number of the PMOS transistors that are turned off increases by one in the termination unit 510. Accordingly, the voltage level of the calibration node CN is lowered. For example, when the counter 522 receives the negative matching signal MS at a low level, the counter 522 outputs a decreasing counting value CV. Accordingly, one bit decreases in the digital control code DCC. That is, the high-level bit decreases in the digital control code DCC, which means that the number of PMOS transistors that are turned off decreases by one in the termination unit 510. Accordingly, the voltage level of the calibration node CN is increased.

As described above, the ODT circuit 500 matches the termination impedance with the external resistor R by comparing the voltage of the calibration node CN with the reference voltage Vref when performing ODT operation. Accordingly, the PMOS transistors 511~513 may be turned on/off in response to the digital control code DCC without adjusting voltage applied to each gate of the PMOS transistors 511~513. Therefore, the circuit may be implemented in a more simplified configuration, and current consumption may be reduced by turning on some of the PMOS transistors 511~513 which is (are) required for calibrating the voltage level of the calibration node CN.

In addition, the ODT operation may be individually performed on each of the external pins.

Figure 10:
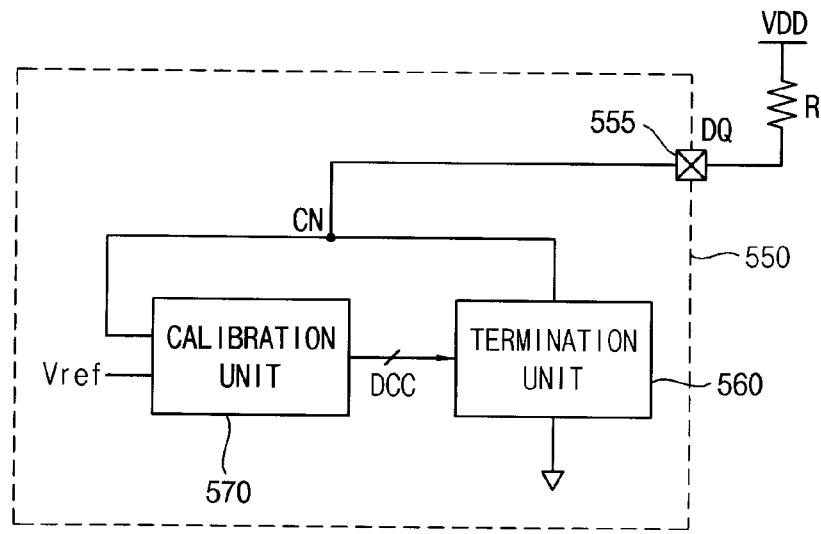
FIG. 10 is a schematic block diagram illustrating an off-chip driver (OCD), according to some exemplary embodiments.

FIG. 10 is a block diagram illustrating an off-chip driver (OCD) according to some exemplary embodiments.

Referring to FIG. 10, an OCD 550 according to some exemplary embodiments may include a termination unit 560 and a calibration unit 570. The termination unit 510 and the calibration unit 570 are connected in parallel to a calibration node CN connected to the external pin 555. The external pin 505 is connected to an external resistor R via a channel. The termination unit 560 may provide a driver impedance that matches with the external resistor R to the channel connected to the external pin 505, in response to a digital control code DCC. The calibration unit 570 generates the digital control code DCC and forwards the DCC to the termination unit 560 based on a voltage of the calibration node CN and a reference voltage Vref such that the driver impedance matches with the external resistor R. For example, the external pin 555 may be a data input/output (DQ) pin, a data strobe (DQS) pin, a data mask (DM) pin, a termination data strobe (TDQS) pin, or the like. The term "pin" broadly refers to an electrical interconnection for an integrated circuit, e.g., a pad or other electrical contact on the integrated circuit.

The OCD 550 varies the driver impedance provided from the termination unit 560 through the digital control code DCC such that the voltage level of the calibration node CN is substantially the same as the reference voltage Vref and the termination impedance matches with the external resistor R. In addition, the OCD 550 is separately connected to the external pin 555 from the data output buffer, which transfers the read data through the external pin. That is, the OCD 550 may be included in the data output buffer 300 of FIG. 7, or the OCD 550 and the data output buffer 300 may be connected to the external pin in parallel, and the OCD 550 may provide the driver impedance matching with the external resistor R. When the OCD 550 provides the driver impedance, the data output buffer 300 may not provide the driver impedance.

Figure 11:
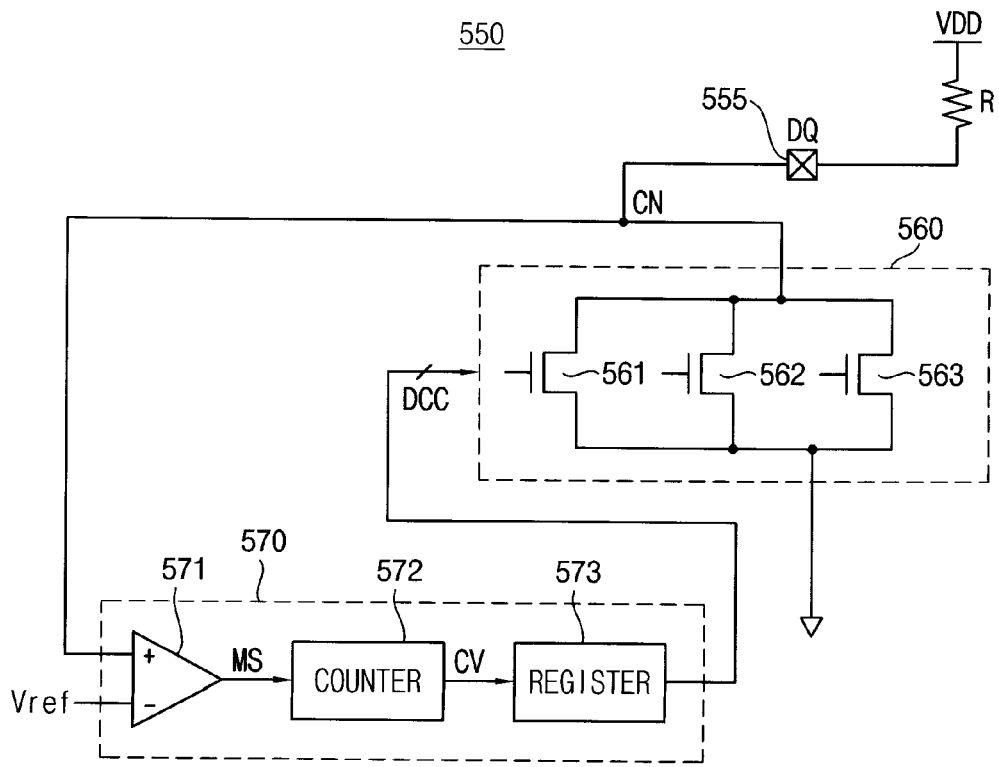
FIG. 11 is a schematic circuit diagram illustrating the OCD of FIG. 10, according to some exemplary embodiments.

FIG. 11 is a schematic circuit diagram illustrating the OCD of FIG. 10 in detail, according to some exemplary embodiments.

Referring to FIG. 11, the termination unit 560 includes a plurality of NMOS transistors 561, 562 and 563 connected between the calibration node CN and a ground voltage. Each of the NMOS transistors 561, 562 and 563 is turned on/off in response to a respective bit of the digital control code DCC at each gate. The voltage level of the calibration node CN may be varied in response to the NMOS transistors 561, 562 and 563 being turned on/off. The PMOS transistors 561, 562 and 563 are different in size with respect to each other. For example, the size ratio of the PMOS transistors 561, 562 and 563 may be 4:2:1, in some particular embodiments.

The calibration unit 570 includes a comparator 571, a counter 572 and a register 573. The comparator 571 compares the voltage of the calibration node CN and the reference voltage Vref to generate and provide a matching signal MS indicating the comparison result to the counter 572. When the voltage level of the calibration node CN is higher than the reference voltage Vref, a positive matching signal MS is provided to the counter 572. When the voltage level of the calibration node CN is lower than the reference voltage Vref, a negative matching signal MS is provided to the counter 572. When the voltage level of the calibration node CN is same as the reference voltage Vref, the matching signal MS of "0" is provided to the counter 572. In some particular embodiments, the reference voltage Vref has a level that is half of the power supply voltage VDD.

The counter 572 outputs a counting value CV that is increasing/decreasing in response to the matching signal MS. For example, when the counter 572 receives the positive matching signal MS, the counter 572 outputs a decreasing counting value CV. For example, when the counter 572 receives the negative matching signal MS at a low level, the counter 522 outputs an increasing counting value CV. For example, when the counter 572 receives the matching signal MS of "0", the counter 572 maintains the counting value CV.

The register 573 stores the counting value CV, and provides the stored counting value CV as the digital control code DCC to the termination unit 560. For example, when the counter 572 receives the positive matching signal MS, the counter 522 outputs a decreasing counting value CV. Accordingly, one bit decreases in the digital control code DCC. That is, a high-level bit decreases in the digital control code DCC, which means that the number of the NMOS transistors that are turned off increases by one in the termination unit 560. Accordingly, the voltage level of the calibration node CN is lowered. That is, the driver impedance increases. For example, when the counter 572 receives the negative matching signal MS at a low level, the counter 572 outputs an increasing counting value CV. Accordingly, one bit increases in the digital control code DCC. That is, a high-level bit increases in the digital control code DCC, which means that the number of the NMOS transistors that are turned off decreases by one in the termination unit 560. Accordingly, the voltage level of the calibration node CN is raised. That is, the driver impedance decreases.

As described above, the OCD 550 matches the driver impedance with the external resistor R by comparing the voltage of the calibration node CN with the reference voltage Vref when performing driver operation. Accordingly, the NMOS transistors 561~563 may be simply turned on/off in response to the digital control code DCC without adjusting voltage applied to each gate of the NMOS transistors 561~563. Therefore, the circuit may be implemented in a simplified configuration, and current consumption may be reduced by simply turning on some of the NMOS transistors 561~563 which is (are) required for calibrating the voltage level of the calibration node CN.

In addition, the driver impedance calibration may be individually performed to each of the external pins.

Figure 12:
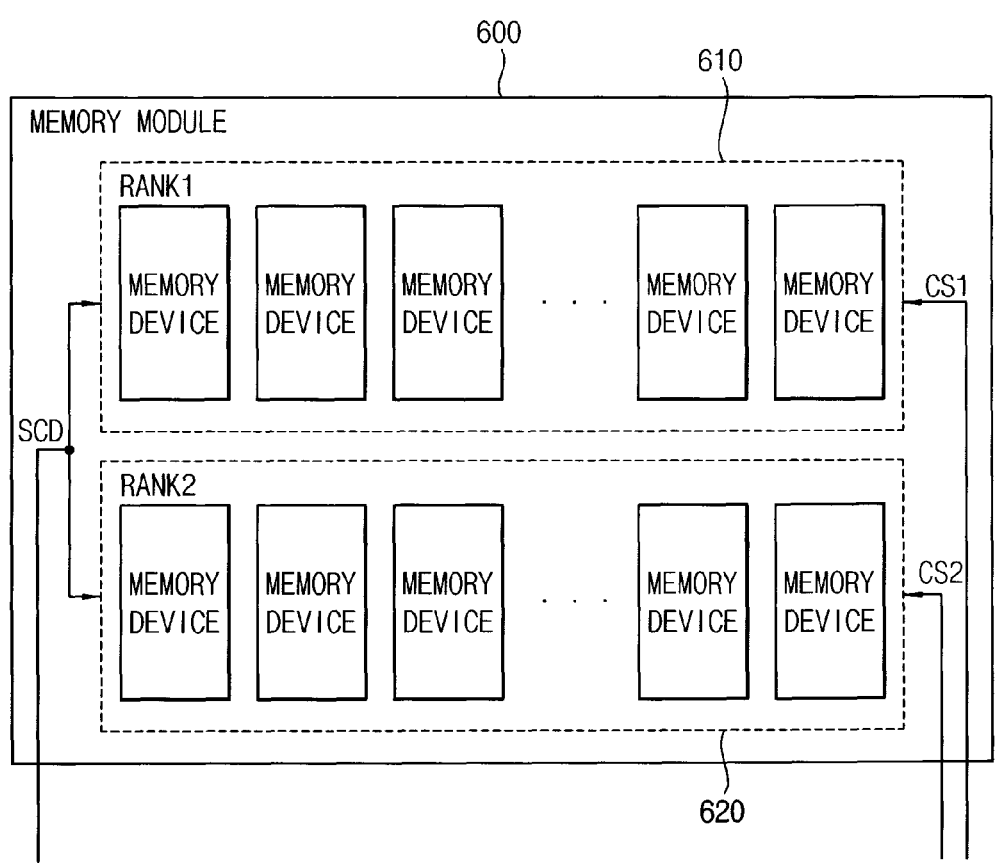
FIG. 12 is a schematic block diagram illustrating a memory module, according to some exemplary embodiments.

FIG. 12 is a schematic block diagram illustrating a memory module according to some exemplary embodiments.

Referring to FIG. 12, a memory module 600 according to some exemplary embodiments includes a first memory rank 610 and a second memory rank 620.

The first memory rank 610 and the second memory rank 620 receive a first chip select signal CS1 and a second chip select signal CS2, respectively. The first memory rank 610 and the second memory rank 620 may be selectively operated in response to the first chip select signal CS1 and the second chip select signal CS2, respectively. The first memory rank 610 and the second memory rank 620 may be disposed on the same side or on different sides of the memory module 600. Although the memory module 600 is illustrated in FIG. 12 as including two memory ranks 610 and 620, the memory module 600 may include one or more memory ranks.

Each of the first memory rank 610 and the second memory rank 620 may include a plurality of memory devices. Each memory device may be a memory device 400 illustrated in and described in detail above in connection with FIG. 7. Each memory device receives the strength code SCD from the memory controller through an ODT pin.

FIGS. 13A through 13F are schematic block diagrams illustrating examples of a memory module according to some exemplary embodiments.

Figure 13A:
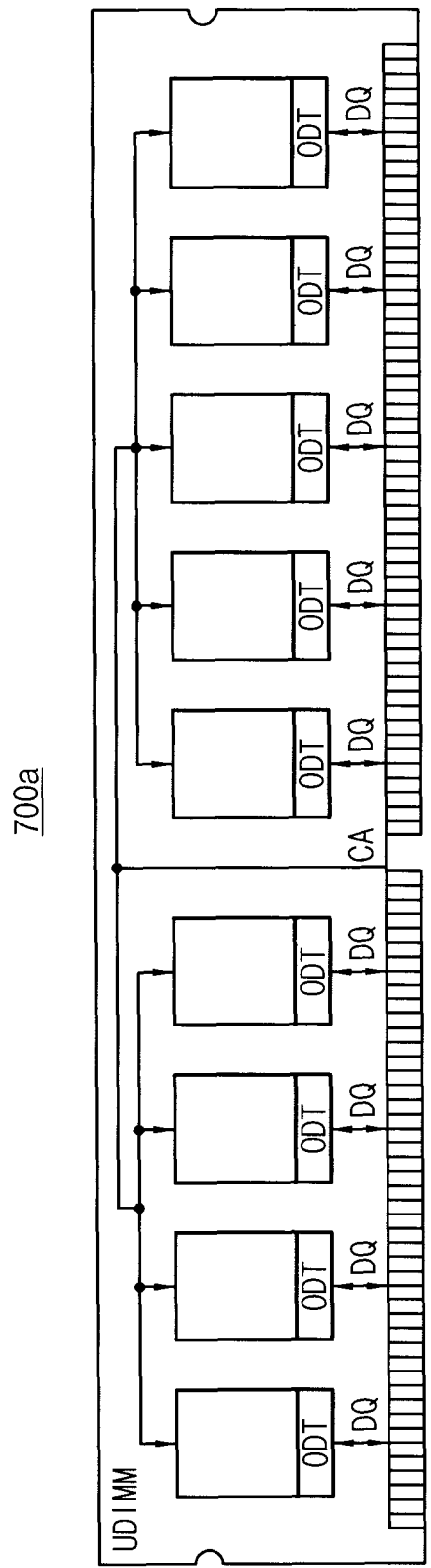
FIGS. 13A through 13F are schematic block diagrams illustrating examples of a memory module, according to some exemplary embodiments.

Referring to FIG. 13A, a memory module 700a according to some exemplary embodiments may be implemented as an unbuffered dual in-line memory module (UDIMM). The memory module 700a may include a plurality of memory devices that provide ODT to data transmission lines DQ. The memory devices may be coupled to the data transmission lines DQ, and may be coupled to command/address transmission lines CA in a tree topology. In some embodiments, a pseudo-differential signaling using a reference data voltage and a reference command/address voltage may be employed for transferring data and a command/address.

Figure 13B:
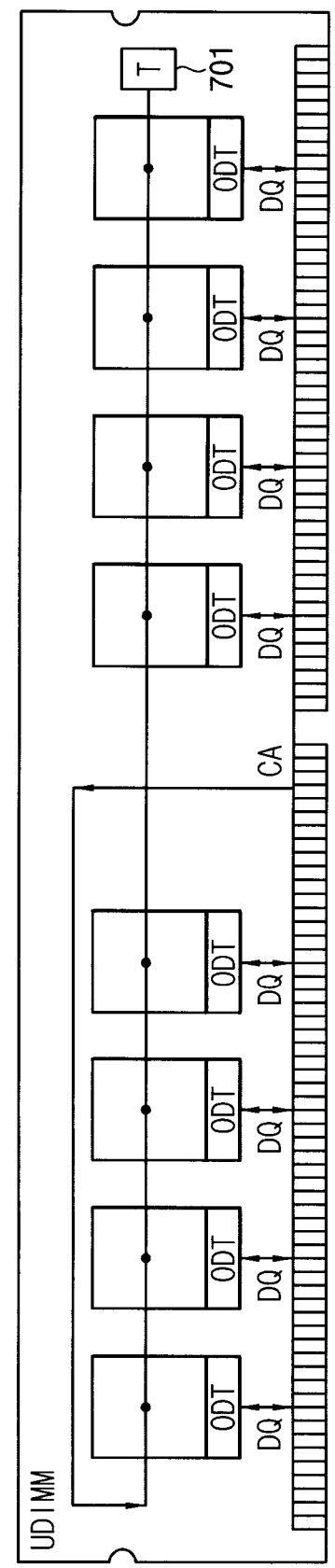

Referring to FIG. 13B, a memory module 700b according to some exemplary embodiments may be implemented as an UDIMM. The memory module 700b may include a plurality of memory devices that provide ODT to data transmission lines DQ, and a module termination resistor unit 701 coupled to one end of command/address transmission lines CA. The command/address transmission lines CA may be coupled to the memory devices in a fly-by daisy-chain topology. The memory module 700b may perform read/write leveling.

Figure 13C:
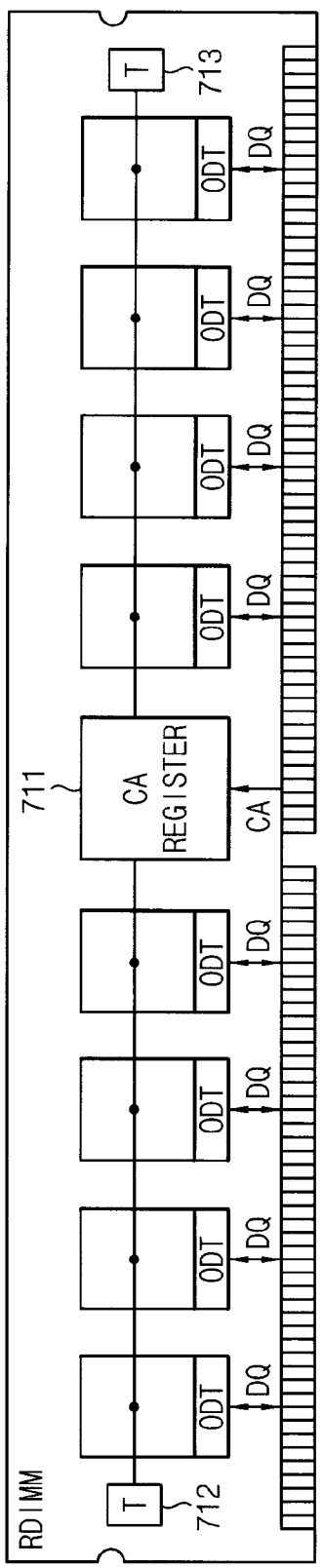

Referring to FIG. 13C, a memory module 700c according to some exemplary embodiments may be implemented as a registered dual in-line memory module (RDIMM). The memory module 700c may include a plurality of memory devices that provide ODT to data transmission lines DQ, a command/address register 711 that provide a command/address signal to the memory devices through command/address transmission lines CA, and module resistor units 712 and 713 coupled to both ends of the command/address transmission lines CA. The command/address register 711 may be coupled to the memory devices in a daisy-chain topology.

Figure 13D:
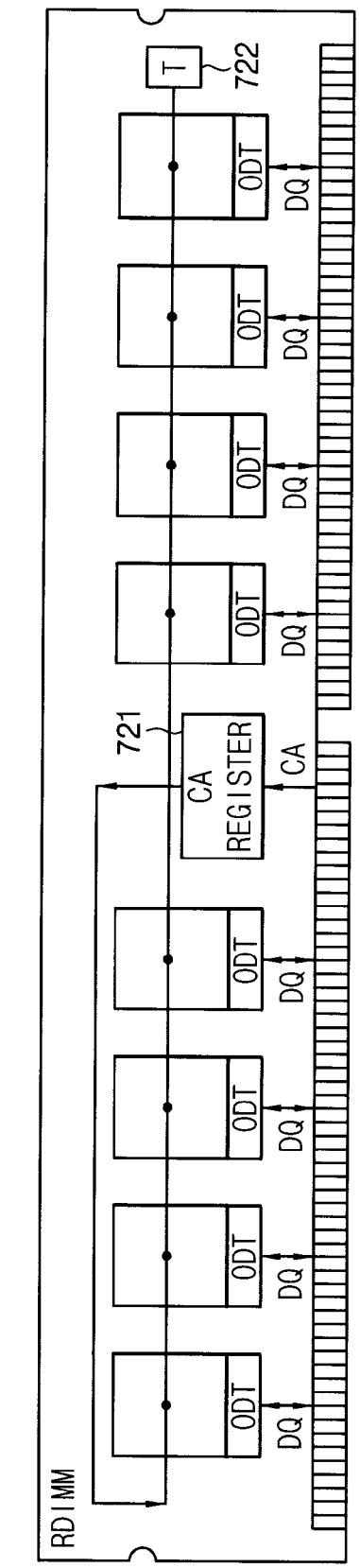

Referring to FIG. 13D, a memory module 700d according to some exemplary embodiments may be implemented as a RDIMM. The memory module 700d may include a plurality of memory devices that provide ODT to data transmission lines DQ, a command/address register 721 that provide a command/address signal to the memory devices through command/address transmission lines CA, and a module resistor unit 722 coupled to one end of the command/address transmission lines CA. The command/address register 721 may be coupled to the memory devices in a fly-by daisy-chain topology. The memory module 700d may perform read/write leveling.

Figure 13E:
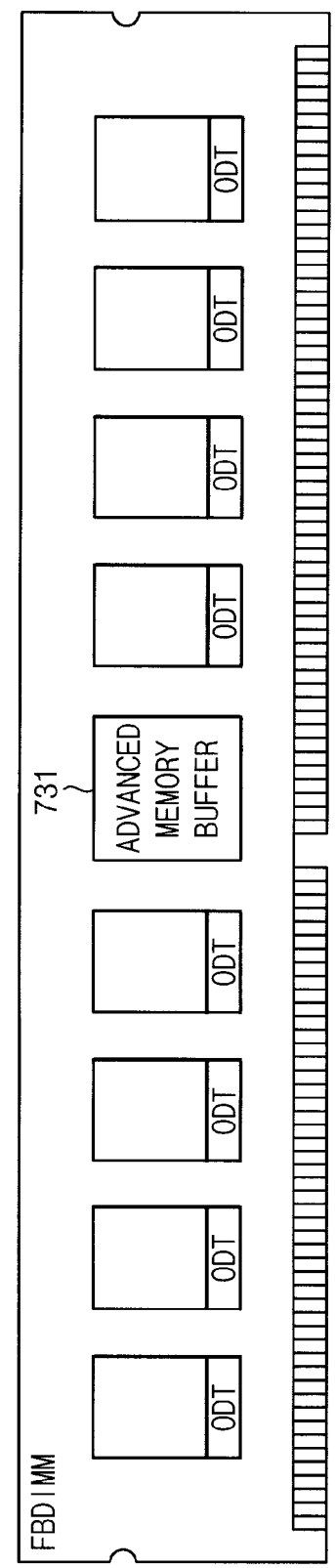

Referring to FIG. 13E, a memory module 700e according to some exemplary embodiments may be implemented as a fully buffered dual in-line memory module (FBDIMM). The memory module 700e may include a plurality of memory devices that provide ODT to data transmission lines, and a hub 731 that provides a command/address signal and data by converting a high-speed packet received from a memory controller. For example, the hub 173 may be an advanced memory buffer AMB.

Figure 13F:
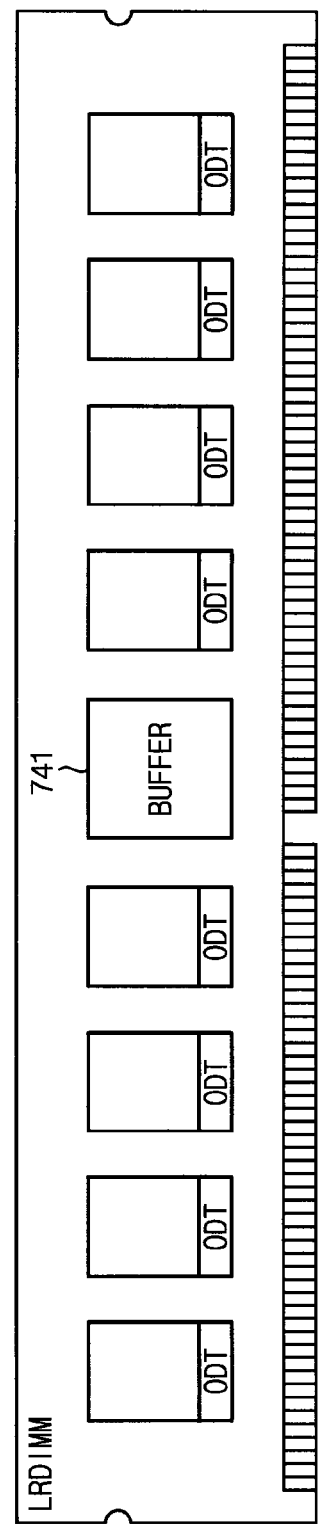

Referring to FIG. 13F, a memory module 700f may be implemented as a load reduced dual in-line memory module LRDIMM. The memory module 700f may include a plurality of memory devices that provide ODT to data transmission lines, and a buffer 741 that provides a command/address signal and data by buffering the command/address signal and the data from a memory controller through a plurality of transmission lines. Data transmission lines between the buffer 741 and the memory devices may be coupled in a point-to-point topology. Command/address transmission lines between the buffer 741 and the memory devices may be coupled in a multi-drop topology, a daisy-chain topology, a fly-by daisy-chain topology, or the like. Since the buffer 741 buffers both the command/address signal and the data, the memory controller may interface with the memory module 700f by driving only a load of the buffer 741. Accordingly, the memory module 700f may include more memory devices and more memory ranks, and a memory system may include more memory modules.

Figure 14:
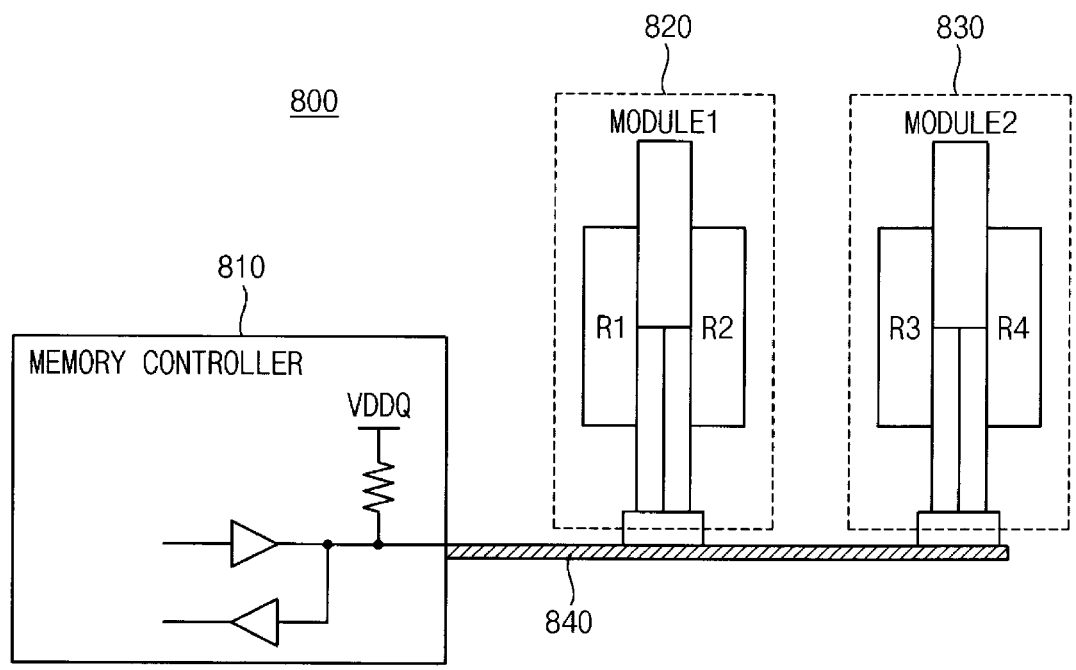
FIG. 14 is a schematic block diagram illustrating a memory system, according to some exemplary embodiments.

FIG. 14 is a schematic block diagram illustrating a memory system according to some exemplary embodiments.

Referring to FIG. 14, a memory system 800 according to some exemplary embodiments includes a memory controller 810 and at least one memory module 820 and 830.

A first memory module 820 and a second memory module 830 may be coupled to a memory controller 810 via a bus 840. Each of the first memory module 820 and the second memory module 830 may be, for example, a memory module 600 of FIG. 12 or a memory module 700a through 1700f of FIGS. 13A through 13F.

The first memory module 820 may include at least one memory rank R1 and R2, and the second memory module 830 may include at least one memory rank R3 and R4. In some embodiments, the memory ranks R1, R2, R3 and R4 may be coupled in a multi-drop topology, which shares transmission lines. The memory ranks R1, R2, R3 and R4 (or memory devices included in the memory ranks R1, R2, R3 and R4) may provide termination impedance to data transmission lines, in accordance with the various embodiments of the inventive concept described in detail herein, thereby improving signal integrity. In some embodiments, the memory controller 810 may perform ODT. For example, the memory controller 810 may perform a pull-up termination operation using a pull-up resistor RTT coupled between a power supply voltage VDDQ and a transmission line.

As described above, an ODT circuit, a data output buffer and a semiconductor memory device according to some exemplary embodiments may reduce current consumption and enhance signal integrity by varying the termination/ driver impedance provided to the transmission line according to the strength code associated with the data rate.

The exemplary embodiments may be usefully employed in semiconductor memory devices, memory modules and memory systems.

The foregoing is illustrative of exemplary embodiments and is not to be construed as limiting thereof. Although some exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. An on-die termination (ODT) circuit of a semiconductor memory device, comprising:
    a termination resistor unit connected to an external pin, the termination resistor unit being configured to provide termination impedance to a transmission line connected to the external pin; and
    a termination control unit connected to the termination resistor unit, the termination control unit being configured to vary the termination impedance in response to a plurality of bits of strength code associated with a data rate, wherein the termination control unit is configured to decrease the termination impedance as the data rate increases.

2. The ODT circuit of claim 1, wherein the termination control unit is configured to increase the termination impedance as the data rate decreases.

3. The ODT circuit of claim 1, further comprising an extended mode register set (EMRS) configured to provide the strength code based on the data rate.

4. The ODT circuit of claim 1, wherein the termination control unit is configured to generate a plurality of bits of termination control signal, the termination control unit being is enabled in response to the strength code and an output enable signal, and wherein the termination resistor unit includes:
    a plurality of transistors, each transistor being coupled to a power supply voltage and being controlled by a bit of the termination control signal; and
    a plurality of resistors, each resistor being connected between one of the transistors and the external pin.

5. The ODT circuit of claim 4, wherein each of the transistors is turned off in response to a bit of the termination control signal when the output enable signal designates a read mode.

6. A data output buffer of a semiconductor memory device, comprising:
    a driving unit coupled to an external pin, the driving unit being configured to provide a driver impedance to a transmission line while performing a driver operation that provides read data to a memory controller through the transmission line connected to the external pin; and
    a control unit connected to the driving unit, the control unit being configured to control the driving unit to perform the driver operation in response to an output enable signal, and to generate a driving control signal for controlling the driving unit by combining the read data and a strength code associated with a data rate, the driver impedance being varied in response to the strength code.

7. The data output buffer of claim 6, wherein the output enable signal is enabled in a read mode, and wherein the control unit is configured to generate a pull-up driving control signal and a pull-down driving control signal by combining the read data and the strength code, and to provide the pull-up driving control signal and the pull-down driving control signal to the driving unit in response to the output enable signal.

8. The data output buffer of claim 7, wherein the driving unit comprises:
    a pull-up driver connected to a power supply voltage and the external pin, the pull-up driver receiving the pull-up driving control signal; and
    a pull-down driver connected to a ground voltage and the external pin, the pull-down driver receiving the pull-down driving control signal.

9. The data output buffer of claim 8, wherein the pull-up driver is configured to provide a pull-up driver impedance that is varied in response to the pull-up driving control signal.

10. The data output buffer of claim 8, wherein the pull-down driver is configured to provide a pull-down driver impedance that is varied in response to the pull-down driving control signal.

11. The data output buffer of claim 8, wherein the pull-up driver comprises:
    a plurality of p-type metal oxide semiconductor (PMOS) transistors, each PMOS transistor being connected to the power supply voltage and being turned on in response to a bit of the pull-up driving control signal; and
    a plurality of resistors, each connected between one of the PMOS transistors and the external pin.

12. The data output buffer of claim 8, wherein the pull-down driver comprises:
    a plurality of n-type MOS (NMOS) transistors, each NMOS transistor being connected to the ground voltage and being turned on in response to a bit of the pull-down driving control signal; and
    a plurality of resistors, each connected between one of the NMOS transistors and the external pin.

13. The data output buffer of claim 8, wherein the power supply voltage is about 0.2 [V].

14. A semiconductor memory device, comprising:
    a memory core configured to store data, the memory core being configured to generate read data based on the stored data; and
    a data output buffer configured to output the read data from the memory core to a memory controller through a transmission line connected to an external pin, and configured to provide a driver impedance to the transmission line in a read mode, the driver impedance being varied in response to a plurality of bits of strength code associated with a data rate.

15. A semiconductor memory device, comprising:
    an on-die termination (ODT) circuit, comprising:
        a termination resistor unit, connected to an external pin, configured to provide termination impedance to a transmission line connected to the external pin, and
        a termination control unit, connected to the termination resistor unit, configured to vary the termination impedance in response to a plurality of bits of strength code associated with a data rate; and
    a data output buffer, comprising:
        a driving unit, coupled to the external pin, configured to provide a driver impedance to the transmission line while performing a driver operation that provides read data to a memory controller through the transmission line connected to the external pin; and
        a control unit, connected to the driving unit, configured to control the driving unit to perform the driver operation in response to an output enable signal, and to generate a driving control signal for controlling the driving unit by combining the read data and the strength code associated with the data rate, the driver impedance being varied in response to the strength code.

16. The semiconductor memory device of claim 15, wherein the strength code is provided from an extended mode register set (EMRS) based on the data rate.

17. The semiconductor memory device of claim 15, wherein the termination control unit generates a plurality of bits of termination control signal which is enabled in response to the strength code and an output enable signal, and wherein the termination resistor unit includes:
   a plurality of transistors, each transistor being coupled to a power supply voltage and being controlled by a bit of the termination control signal; and
   a plurality of resistors, each resistor being connected between one of the transistors and the external pin.

18. The semiconductor memory device of claim 15, wherein the output enable signal is enabled in a read mode,
   and wherein the control unit generates a pull-up driving control signal and a pull-down driving control signal by combining the read data and the strength code, and provides the pull-up driving control signal and the pull-down driving control signal to the driving unit in response to the output enable signal.

19. The semiconductor memory device of claim 18, wherein the driving unit comprises:
   a pull-up driver, connected to a power supply voltage and the external pin, the pull-up driver receiving the pull-up driving control signal; and
   a pull-down driver, connected to a ground voltage and the external pin, the pull-down driver receiving the pull-down driving control signal.

* * * * *